(12) United States Patent
Niuya

(10) Patent No.: US 6,617,211 B1
(45) Date of Patent: Sep. 9, 2003

(54) METHOD FOR FORMING A MEMORY INTEGRATED CIRCUIT

(75) Inventor: Takayuki Niuya, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 08/971,014

(22) Filed: Nov. 14, 1997

(51) Int. Cl.[7] .................... H01L 21/8242; H01L 21/20; H01L 21/4793; H01L 21/44

(52) U.S. Cl. .................. 438/253; 438/396; 438/640; 438/657

(58) Field of Search .................. 438/293, 396, 438/586, 639, 640, 657, 669

(56) References Cited

U.S. PATENT DOCUMENTS

| | | | | |
|---|---|---|---|---|
| 5,346,844 A | * | 9/1994 | Cho et al. ............... | 438/253 |
| 5,478,768 A | * | 12/1995 | Iwasa .................... | 438/253 |
| 5,801,079 A | * | 9/1998 | Takaishi ................. | 438/396 |
| 5,933,724 A | * | 8/1999 | Sekiguchi et al. ........ | 438/239 |
| 5,972,747 A | * | 10/1999 | Hong .................... | 438/253 |

OTHER PUBLICATIONS

Stanley Wolf Ph.D. in Silicon Processing for the VLSI Era, vol. 2: Process Integration, Lattics Press, pp. 274 and 275, Jan. 1990.*

* cited by examiner

Primary Examiner—Olik Chaudhuri
Assistant Examiner—William M. Brewster
(74) Attorney, Agent, or Firm—Carlton H. Hoel; W. James Brady; Frederick J. Telecky, Jr.

(57) ABSTRACT

A process for fabricating a crown-cell capacitor in a memory integrated circuit. The process includes the step of forming a transistor having a contact region 353 at a surface of a semiconductor substrate 300. The transistor, with the exception of the contact region, is covered with a first material 362, 366 and the first material and the contact region are then covered with a layer of a second material 370. The portion of the second layer covering the contact region is removed to expose the contact region so that the removal of the portions of the second layer forms a cavity characterized by a bottom formed of the first material and sides formed of the second material. Further steps in the process include forming a first conductive layer 372 in the cavity to contact the contact region and conform to the bottom and sides, forming a dielectric layer 376 over the first conductive layer, and forming a second conductive layer 378 over the dielectric layer.

16 Claims, 13 Drawing Sheets

METHOD FOR FORMING A MEMORY INTEGRATED CIRCUIT

CROSS-REFERENCE TO RELATED APPLICATIONS

This application includes subject matter which is related to U.S. patent application Ser. No. 08/970,924, filed even date herewith.

FIELD OF THE INVENTION

This invention relates generally to memory integrated circuits, and more specifically to dynamic random access memory integrated circuits.

BACKGROUND OF THE INVENTION

A dynamic random access memory integrated circuit (DRAM) provides temporary storage of digital information. A distinctive feature of the DRAM is that the information stored in the circuit is quickly lost unless it is refreshed. The reason that information storage is only temporary in a DRAM is that the data storage is in the form of a charged capacitor. The cell shown in FIG. 1 is the heart of the memory circuit. It includes a word line 100 and bit line 102 connected to a pass transistor 104 and a capacitor 106. When the voltage on the word line 100 is raised, the pass transistor 104 turns on and the bit line 102 is connected to the storage capacitor 106. The information stored in the cell corresponds to whether the storage capacitor is charged or discharged. Unfortunately, capacitors leak charge and if not refreshed, the cell containing information corresponding to a charged capacitor would soon contain information corresponding to a discharged capacitor.

A natural solution to the problem of charge leakage is simply to increase the size of the capacitor. This approach, however, runs counter to the constant need for a smaller cell size, since in many DRAM circuits the storage capacitors alone can occupy as much as fifty to sixty percent of the die area of the circuit. The high premium placed on die area has resulted in cell designs in which the storage capacitor is formed not on the substrate surface, but instead on a protrusion that extends above the substrate surface. Such vertically-formed capacitors are known in the industry as a "stacked cell." The use of a stacked cell allows for a higher storage capacitance without occupying precious semiconductor die area.

FIG. 2a shows a prior art planar DRAM cell and FIG. 2b shows a prior art stacked cell. In FIG. 2a the "storage node," or the terminal of the capacitor connected to the transistor lies in the semiconductor substrate 200 beneath the capacitor dielectric 202. The other terminal, or field plate, of the planar capacitor is typically polysilicon and is shown as element 204. The wordline 206 comprises the gate interconnection for the pass transistor and lies over the gate dielectric 208 and between the source and drain implantation regions 210. The bitline 212 runs perpendicularly to and over the wordline and storage capacitor. In the stacked cell shown in FIG. 2b, both plates of the capacitor are polysilicon. The storage node 250 is convoluted and only contacts the substrate at transistor contact region 260. The wordline 256 and bitline 262 are in essentially the same position as in the structure of FIG. 2a. The capacitor dielectric 252 is typically oxide or a combination of oxide and nitride. The field plate 254 conforms to the convolutions of the storage node 250 to create a capacitor with a larger surface area than with the capacitor of FIG. 2a. The drastically reduced die area occupied by the stacked cell of FIG. 2b is also apparent in a comparison with the structure of FIG. 2a.

Designers of future generations of DRAMs demand that the storage capacitor occupy even less die area than that of the structure shown in FIG. 2b. One problem with conventional processes for forming stacked cell capacitors is that the vertical nature of the capacitor requires relatively thick layers (typically oxide) for the capacitor's formation. Contact from the capacitor to the contact region (source or drain) of the pass transistor is complicated by the thick layers since the area of contact is often less than 0.5 $\mu$m in dimension, and will continue to be made smaller in future DRAM generations. Forming such a small opening in thick layers is very difficult and is a source of process complexity. For example, conventional processes rely on polysilicon or silicon nitride hardmasks with openings of about 0.36 $\mu$m to gain the selectivity necessary for etching such small holes in thick layers of oxide. Even using such a hardmask, the etch depth that can be achieved is often only about 1.0 $\mu$m when a depth of approximately 50% or greater is desired. To achieve the needed depth, prior processes typically rely on multiple masking steps where the bottom portion of the capacitor contact to the transistor is formed before the thick oxide layers are applied. The hole is then plugged with polysilicon and the thick layers necessary for forming the upper portions of the capacitor follow. The multiple mask steps necessary to form the capacitor in prior processes are thus complicated and economically unattractive. The present invention provides a simpler approach to the formation of stacked capacitors.

SUMMARY OF THE INVENTION

In accordance with the principles of the present invention, there is disclosed herein a process for fabricating a memory integrated circuit. The process addresses the difficulties involved in forming a stacked-cell or crown-cell capacitor that is used in a dynamic random access memory circuit. In particular there is disclosed a process including the step of forming a contact region (typically at the source or drain of a transistor) in a semiconductor material structure, that is, in a structure comprising a semiconductor substrate and any material subsequently applied to the substrate. The semiconductor material structure, with the exception of the contact region, is covered with a first material, and the first material and the contact region are then covered with a layer of a second material. The portion of the second layer covering the contact region is removed to expose the contact region such that the removal of the portions of the second layer forms a cavity characterized by a bottom formed of the first material and sides formed of the second material. Further steps in the process include forming a first conductive layer in the cavity to contact the contact region and conform to the bottom and sides, forming a dielectric layer over the first conductive layer, and forming a second conductive layer over the dielectric layer.

Further in accordance with the principles of the present invention, there is disclosed herein an integrated circuit including a cavity in a multilayer material structure, the cavity including a lower region having a bottom at a contact region and a top having a first width, the cavity further including an upper region having a greater width than the first width. The circuit also includes a first conductive layer formed in the cavity to contact the contact region and to conform to the lower and upper regions of the cavity. A layer of dielectric is formed over the first conductive layer, and a second conductive layer is formed over the dielectric layer.

An advantage of the present invention is that a stacked capacitor can be fabricated with a single etch step rather than with the typical two etch steps.

BRIEF DESCRIPTION OF THE DRAWINGS

The foregoing features of the present invention may be more fully understood from the following detailed description, read in conjunction with the accompanying drawings, wherein.

DETAILED DESCRIPTION OF PREFERRED EMBODIMENTS

Figure 1:
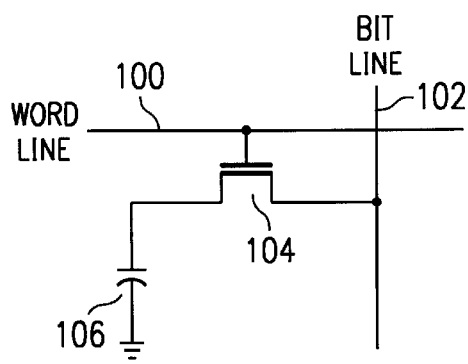
FIG. 1 is a schematic diagram of a prior art memory cell.
Figure 2A:
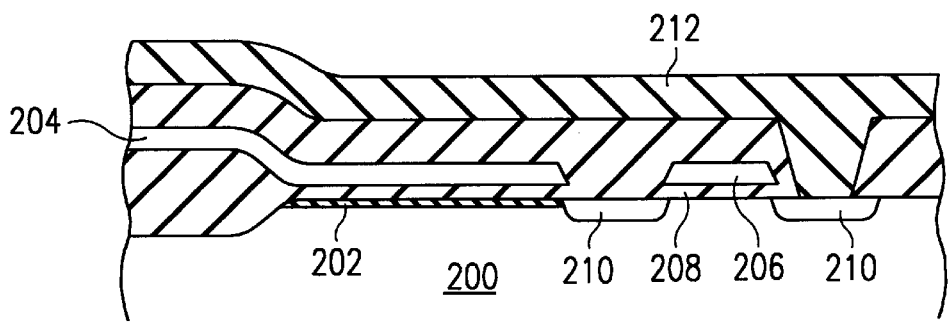
FIG. 2a is a cross-sectional diagram of a prior art memory cell having a planar capacitor.
Figure 2B:
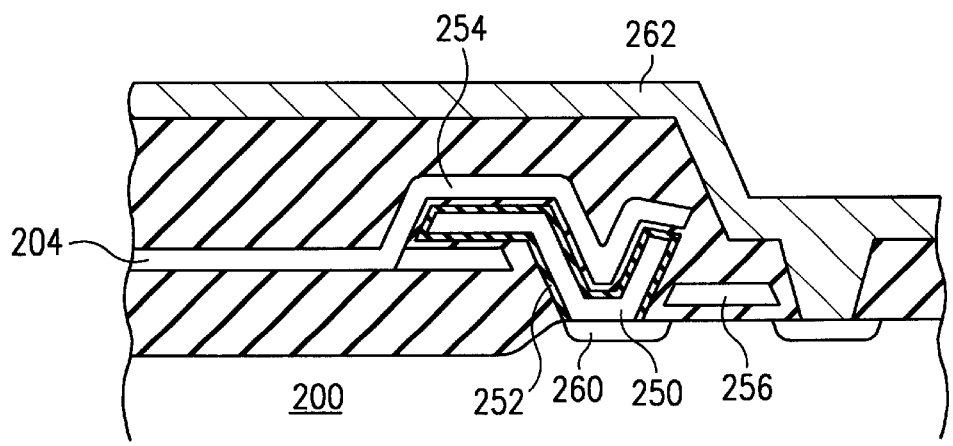
FIG. 2b is a cross-sectional diagram of a prior art memory cell having a stacked cell capacitor.
Figure 3A:
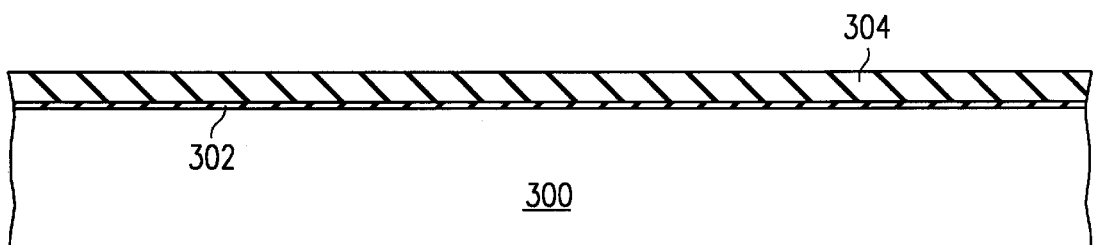
FIGS. 3a to 3bb are cross-sectional diagrams of steps in a first preferred embodiment process.
Figure 3B:
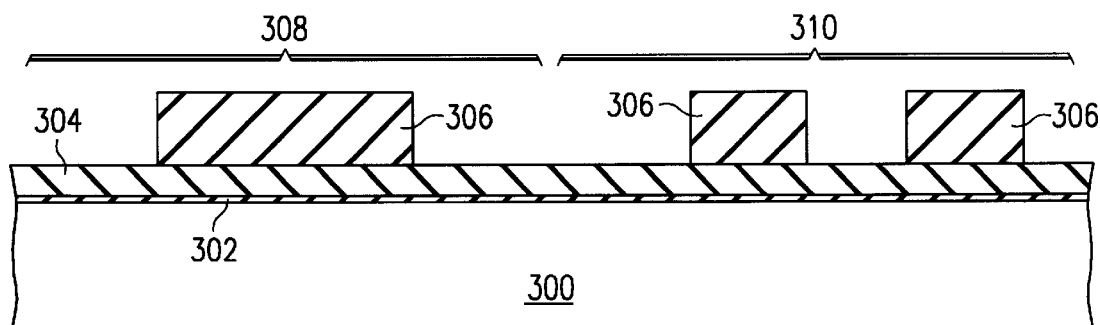

A first preferred embodiment of the invention is shown in FIGS. 3a–3bb. In FIG. 3a a layer 302 of silicon dioxide ($SiO_2$) approximately 13.5 nm in thickness is formed over a silicon substrate 300 having p-type background doping. A layer 304 of silicon nitride ($Si_3N_4$) approximately 140 nm in thickness is then formed over the oxide layer 302. In FIG. 3b photoresist and an anti-reflective coating, shown collectively as layer 306 are deposited and patterned over the nitride layer 304. FIGS. 3b through 3aa are cross-sectional diagrams of a DRAM circuit in which the memory cell is formed in the left portion of the diagram, indicated generally by brackets and element 308. The right portions of the diagrams, indicated generally in FIG. 3b by brackets and element 310, show the structure of the n-mos and p-mos transistors that make up the peripheral circuitry of the integrated circuit.

Figure 3C:
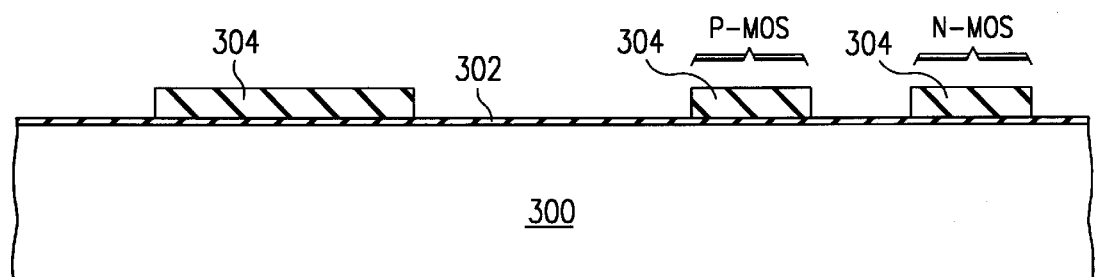
Figure 3D:
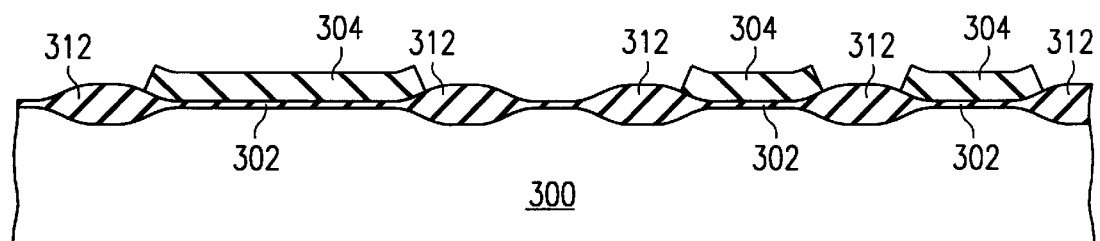

Following the patterning of the photoresist 306, the nitride layer 304 is dry-etched from areas not covered by resist layer 306, as shown in FIG. 3c. In FIG. 3d, field oxide regions 312 are formed by heating the structure in steam at approximately 1050° C. for about 40 minutes. Field oxide regions 312 are approximately 400 nm in thickness. It may be appreciated that forms of isolation other than the local oxidation of silicon may be employed. An example of such an alternative technique is trench isolation.

Figure 3E:
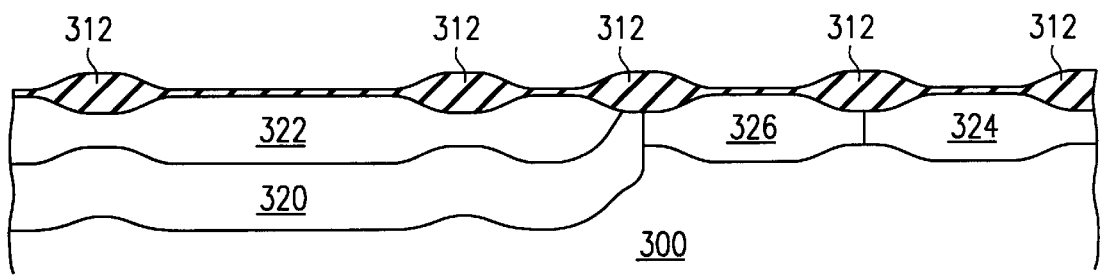

The structure is now ready for a series of implantation steps that yield the structure of FIG. 3e. Initially, the deep well 320 is formed by the implantation of phosphorus for example at a dose of approximately $6 \times 10^{12}$ $cm^{-3}$ and an energy of about 500 keV. The implantation of the p-well 322 over which is formed the memory cell, and the p-well 324 over which the n-mos periphery transistors are formed, comprises a three step boron implantation procedure. The first dose of boron is approximately $8.0 \times 10^{12}$ $cm^{-3}$ at an energy of about 300 keV; the second is approximately $9.0 \times 10^{12}$ $cm^{-3}$ at about 180 keV; and the third is approximately $2.0 \times 10^{12}$ $cm^{-3}$ at about 20 keV. The n-well 326 over which the p-mos periphery transistors are formed comprises a two step implantation of phosphorus for example; the first dose of approximately $2.0 \times 10^{13}$ $cm^{-3}$ at about 500 keV and the second dose of approximately $5.0 \times 10^{12}$ $cm^{-3}$ at about 250 keV.

Figure 3F:
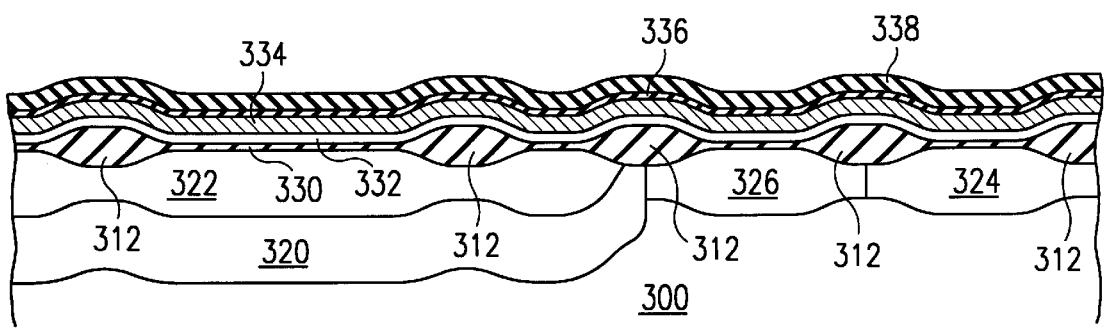

In FIG. 3f the structure is cleaned following the implantation steps and gate oxide 330 is formed at 850° C. in steam. The thickness of the gate oxide is approximately 9 nm. The gate interconnect comprises a polysilicon layer 332 capped by a tungsten silicide ($WSi_2$) layer 334. The polysilicon layer 332 is approximately 62 nm in thickness, while the $WSi_2$ layer 334 is about 120 nm. These layers are then capped by an oxide layer 336 of approximately 10 nm thickness formed through decomposition of tetraethylorthosilicate (TEOS) for example, and a nitride layer 338 of about 200 nm thickness.

Figure 3G:
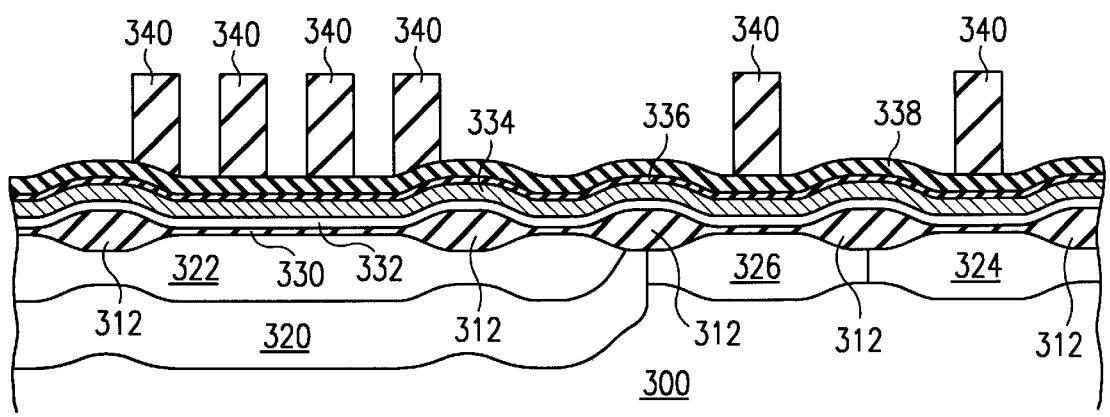
Figure 3H:
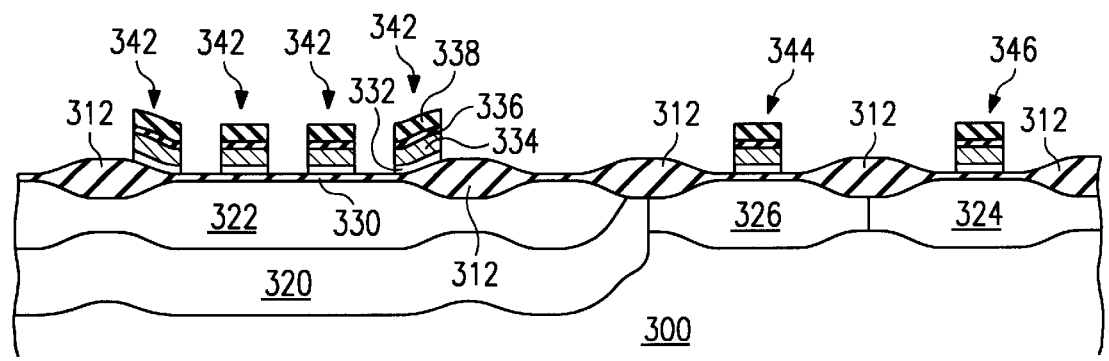

In FIG. 3g, photoresist and an anti-reflection layer (shown compositely as element 340) are deposited and patterned to cover the desired location of the transistor gates. The layers 332, 334, 336, and 338 not covered by photoresist 340 are then removed to leave the structure of FIG. 3h. Gate structures 342 comprise the wordlines of the memory cell, while structures 344 and 346 comprise the gates of exemplary peripheral p-mos and n-mos transistors, respectively. It may be appreciated that the number of gates or wordlines depicted in FIG. 3g and the figures that follow was chosen to facilitate a clear representation of the storage cell capacitors. One skilled in the art will appreciate that the memory array consists of many more similarly arranged wordlines, transistors, and storage cell capacitors than is shown here.

Figure 3I:
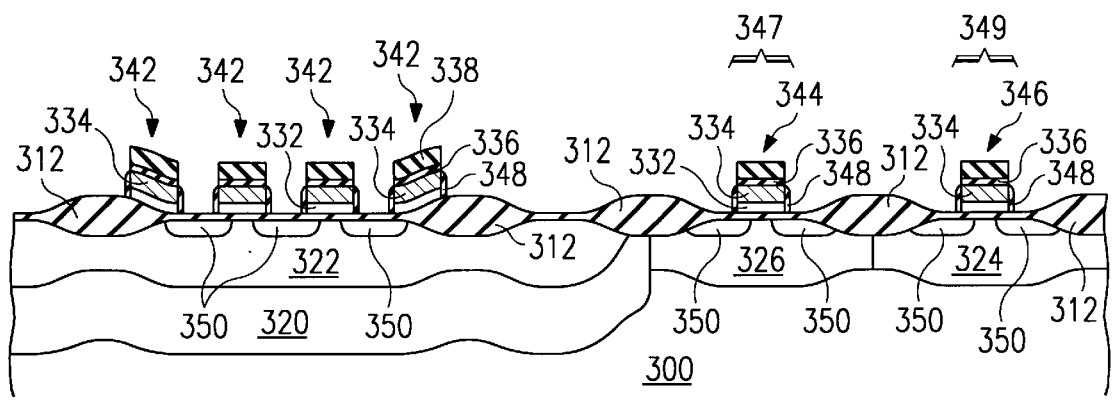

In FIG. 3i the polysilicon 332 and $WSi_2$ 334 layers are oxidized to produce an approximately 9.5 nm thick sidewall oxide 348. This step is followed by the masking of the p-mos transistor 347 and implantation of an initial n-type lightly doped drain (LDD) region 350 over both sides of the memory cell gates 342 and the n-mos gate 346. The memory cell is then masked and a second LDD implant is made for the n-mos transistor 349. Similarly, the memory cell transistors and the n-mos transistor 349 are then masked for the implantation of p-type dopants to form the LDD pattern 350 on either side of gate 344.

Figure 3J:
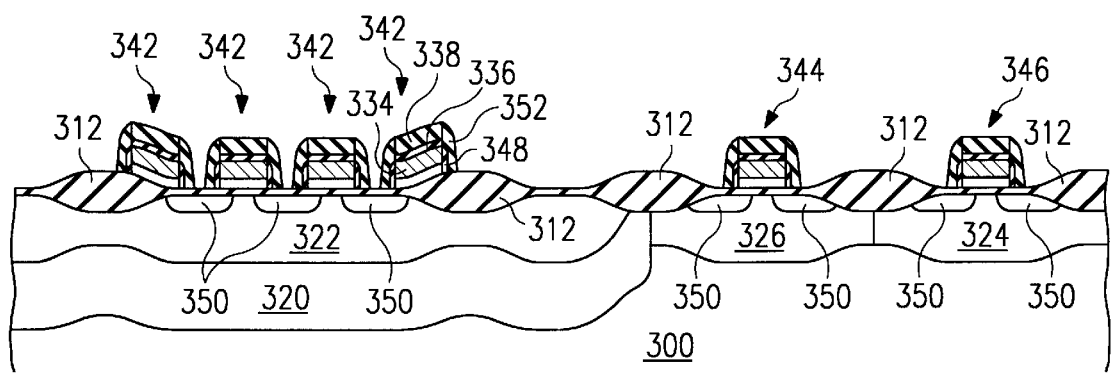

In FIG. 3j a nitride layer 352 is formed over the entire structure to a thickness of approximately 100 nm. The nitride layer 352 is then anisotropically etched to remove the layer from all portions of the structure except the sidewalls of the gate structures. The n-mos and p-mos transistors are then alternately exposed to allow for the implantation of high concentrations of arsenic and boron, for example, which form highly doped source and drain contacts (not separately shown) within the regions 350 previously subjected to the LDD implants.

Figure 3K:
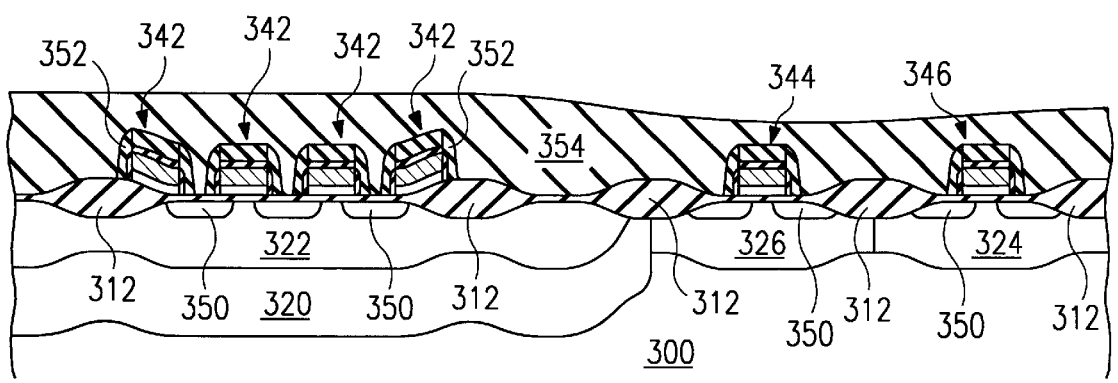

Following the implantation of source/drain dopants, oxide layer 354 is formed over the structure by first decomposing TEOS to produce an approximately 50 nm oxide layer and then by depositing a layer of borophosphosilicate glass (BPSG) in a thickness of approximately 500 nm. The oxide layer is then etched back to a thickness of approximately 120 nm as shown in FIG. 3k.

Figure 3L:
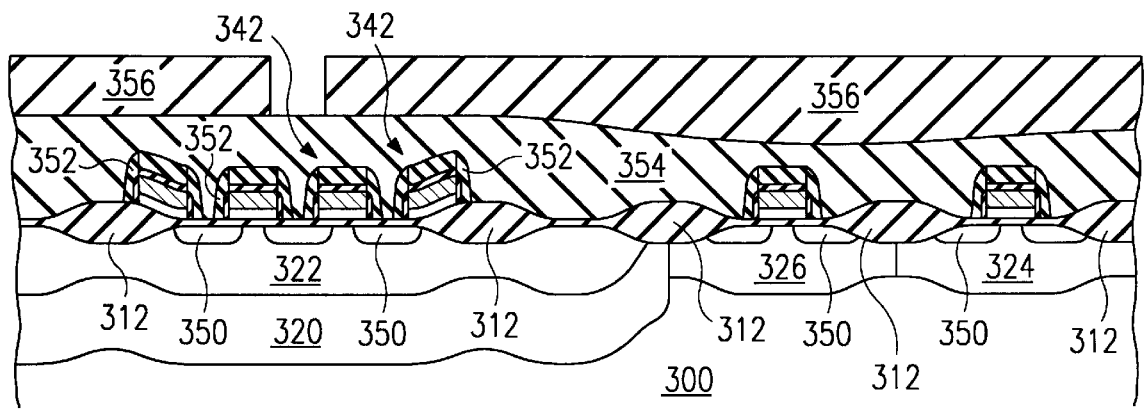

In FIG. 3l photoresist 356 is deposited and patterned to expose the region in which the bitline contact to the memory cell transistors is to be made. The exposed portion of oxide layer 354 is then removed in an anisotropic reactive ion etching process using carbon monoxide (CO) as the primary etchant and at a pressure of approximately 100 mTorr and an RF power of 1500 Watts. The CO etch does not appreciably remove the nitride 352 that coats the sidewalls of gate structures 342. The etching of the oxide and removal of the masking photoresist yields the structure shown in FIG. 3m.

Figure 3M:
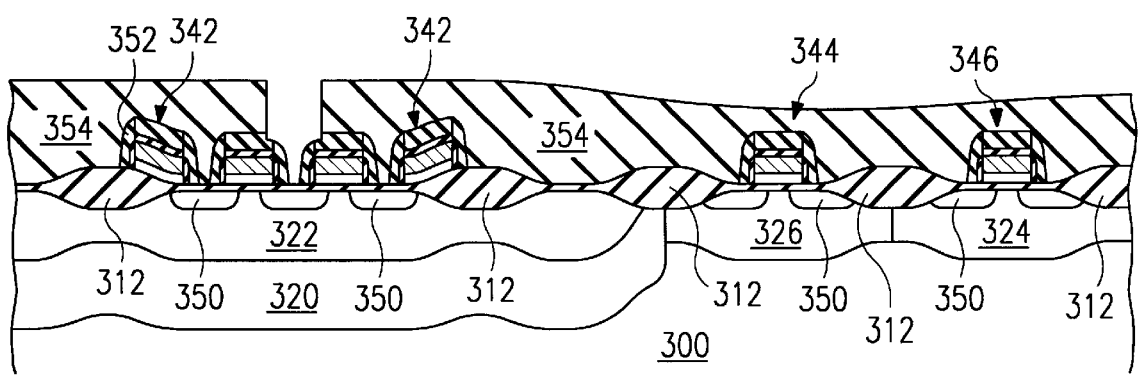
Figure 3N:
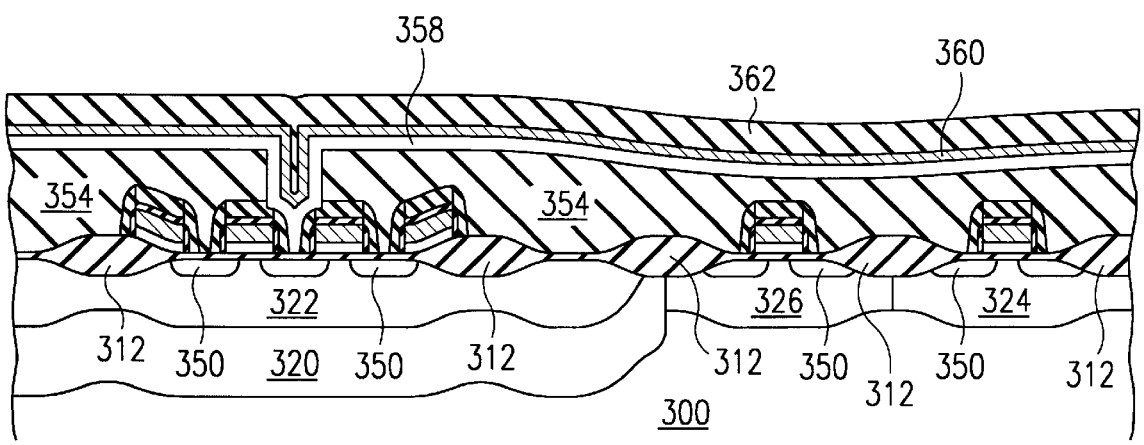

In FIG. 3n the bitline contact to the source/drain implantation region 350 is established by depositing first a polysilicon layer 358 approximately 62.0 nm in thickness to cover the surface of oxide 354 and the depression left by the etching discussed with reference to FIGS. 3l and 3m. Polysilicon layer 358 is doped in situ during its deposition with phosphorus for example to a concentration of approximately $1.65 \times 10^{20}$ $cm^{-3}$. Polysilicon layer 358 is covered with $WSi_2$ layer 360 of about 120.0 nm thickness to lower the overall resistivity of the bitline interconnect. WSi$_2$ layer 360 is then covered with an approximately 200.0 nm nitride layer 362.

Figure 3O:
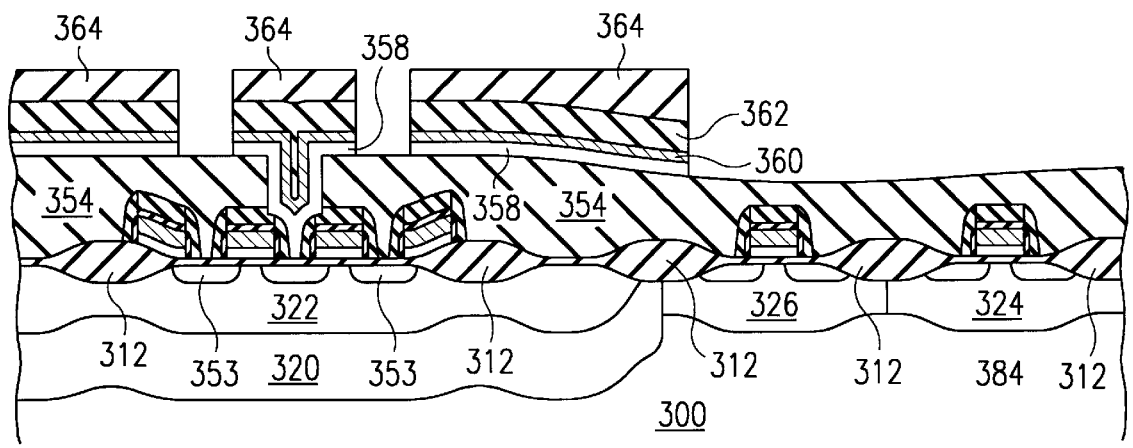

In FIG. 3o the nitride layer 362, WSi$_2$ layer 360, and polysilicon layer 358 are covered with photoresist 364, which is patterned to expose the location of the storage cell capacitor contacts to the source/drain contacts 353 of the memory cell transistors. The nitride layer 362, WSi$_2$ layer 360, and polysilicon layer 358 are removed in an anisotropic etching process. The nitride layer 362 is removed using a reactive ion etching apparatus with SF$_6$ for example being the primary etchant, while the WSi$_2$ and polysilicon layers are removed using a chlorine etch for example.

Figure 3P:
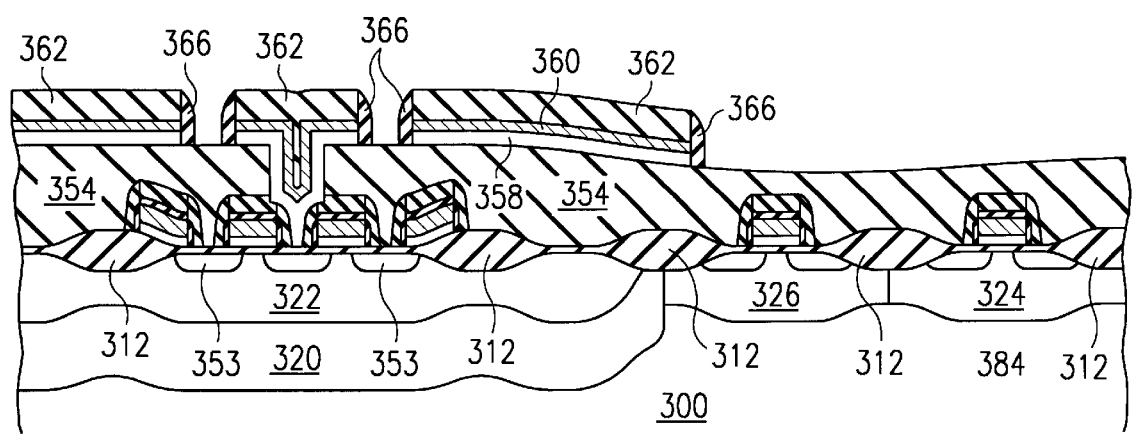

Referring now to FIG. 3p, sidewall nitride 366 is formed by depositing an approximately 100 nm thick layer of silicon nitride over the surface of the structure. The nitride is then anisotropically etched using SF$_6$ for example as the primary etchant to remove the nitride layer from the surface of oxide layer 354 and the surface of nitride layer 362 to leave only nitride sidewalls 366.

Figure 3Q:
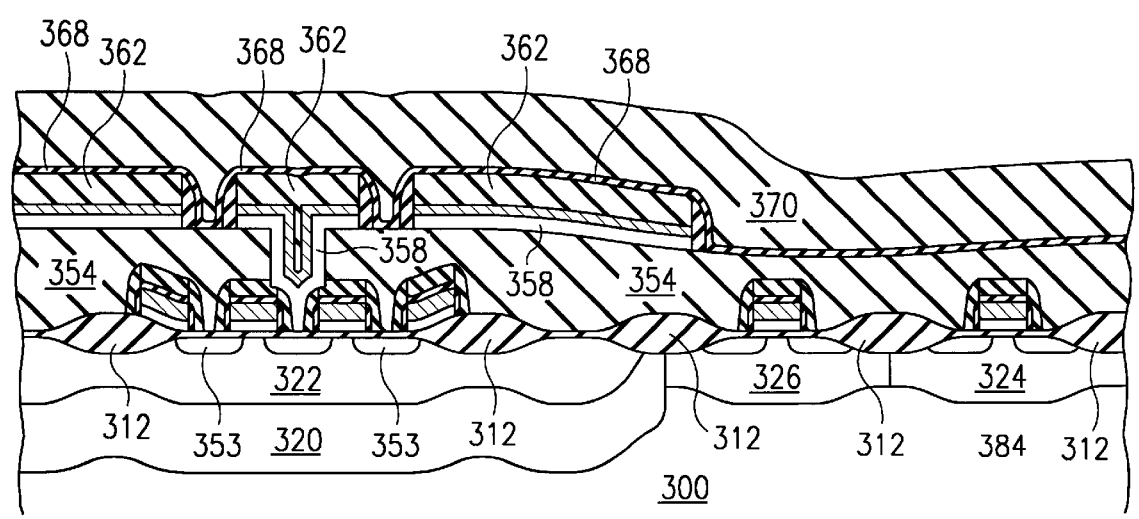
Figure 3R:
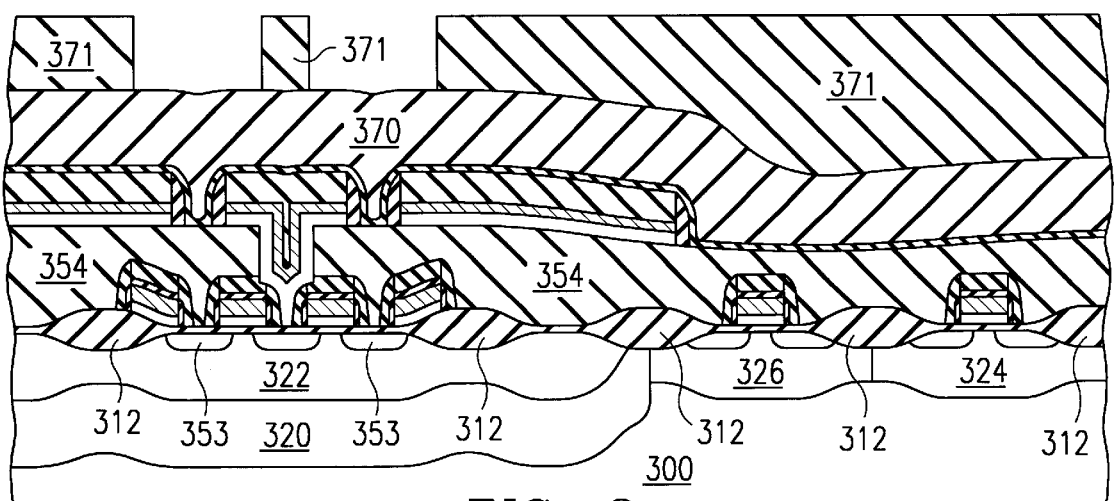
Figure 3S:
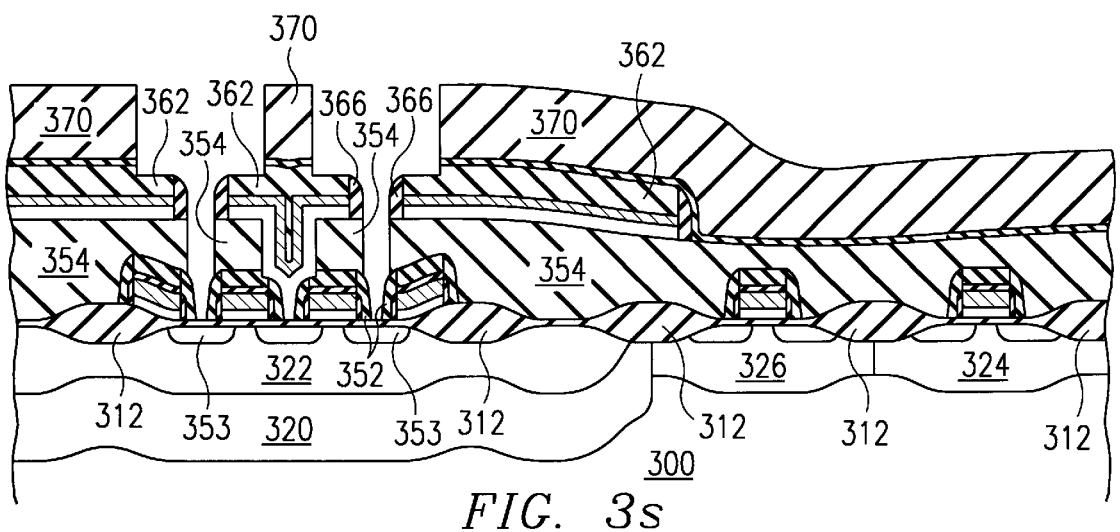

In FIG. 3q an etch stop nitride layer 368 having a thickness of approximately 25 nm is deposited over the surface of the structure. A crown oxide layer 370 is then deposited by decomposition of TEOS over the nitride etch stop layer to a thickness of approximately 500 nm. In FIG. 3r photoresist layer 371 is deposited and patterned to expose the portions of the crown oxide layer 370 over the desired location of the storage cell capacitors. Referring now to FIG. 3s, the exposed portions of crown oxide layer 370 are removed using an anisotropic etching process with carbon monoxide for example as the primary etchant. The removal of the crown oxide layer 370 and oxide layer 354 is performed with relatively little removal of the vertical portion of nitride sidewalls 352 and 366 because of the anisotropic nature of the reactive ion etching process and the selectivity of the carbon monoxide etchant in removing oxide versus nitride layers. The horizontal surfaces of nitride layer 362 and sidewalls 366 and 352, however, are generally, perpendicular to the direction of etching, and therefore a relatively greater portion of those nitride regions is removed during the etch, as is shown in FIG. 3s. The resulting structure includes a cavity with a lower portion defined by sidewall nitride 352, oxide layer 354, and nitride sidewalls 366.

The patterned opening of photoresist layer 371 in the step shown in FIG. 3r is much wider than the lower portion of the cavity formed in FIG. 3s. The opening in the photoresist 371 in FIG. 3r is sufficiently wide (typically between 0.7 and 1.0 $\mu$m) that removal of both the crown oxide layer 370 and the oxide layer 354 may be accomplished in a single etch step. The nitride sidewalls 366 and 352 ensure that the etch is confined in the lower portion of the cavity to the relatively narrow width consistent with exposing contact region 353 (typically about 0.36 $\mu$m), while photoresist 371 defines the dimension of the upper region of the cavity formed essentially by the removal of portions of crown oxide layer 370. It is preferable that the upper portion of the cavity, that is, the portion having sides of the crown oxide layer 370 and a bottom of the nitride regions 362 and 366, be at least about twice as wide as the lower portion, whose width is determined by the nitride sidewalls 366 and 352. The cavity resulting from the single etch step described above possesses a relatively large surface area in which the crown or stacked cell capacitor may be formed.

The removal of oxide layer 354 exposes the source/drain contacts 353 of the memory cell transistors. Electrical contact with the transistor is then established in FIG. 3t by depositing a polysilicon layer 372 that serves as the bottom electrode of the storage cell capacitor. The polysilicon of layer 372 is approximately 62 nm thick and is doped with phosphorus for example to a concentration of approximately 1.65×10$^{20}$ cm$^{-3}$. In FIG. 3u glass layer 374 is then spun on to cover polysilicon layer 372. Glass layer 374 is preferably hydrogen silsesquioxane (HSQ) spun to a thickness of approximately 400 nm. In FIG. 3v glass layer 374 is etched back to expose polysilicon layer 372. Portions of glass layer 374 remain in depressions in the structure coinciding with the desired location of the storage cell capacitor. These remaining portions of layer 374 protect the polysilicon layer 372 when the exposed portions of that layer are removed with a chlorine-based etch as shown in FIG. 3w.

Figure 3T:
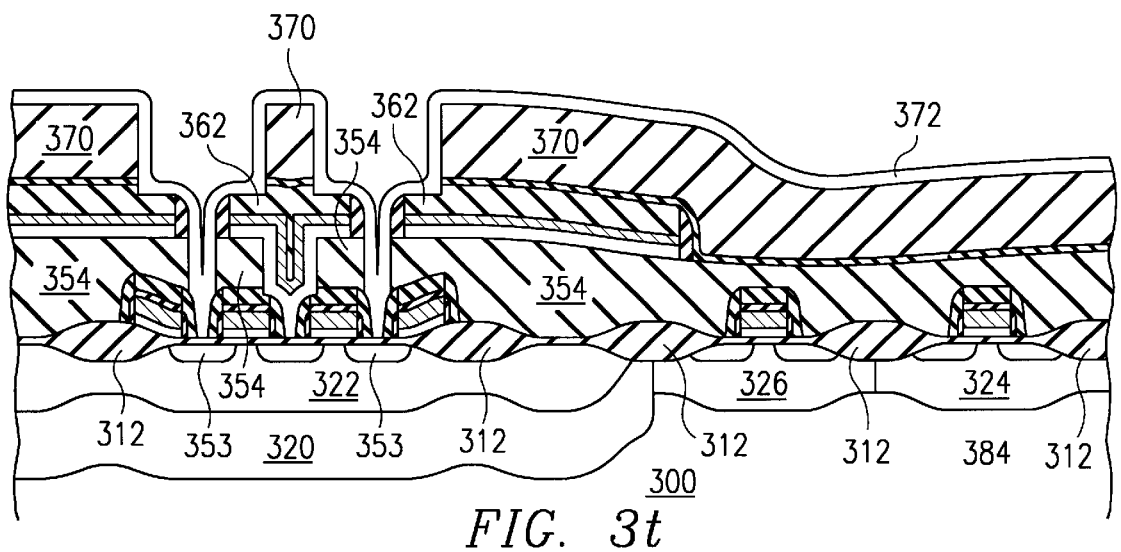
Figure 3U:
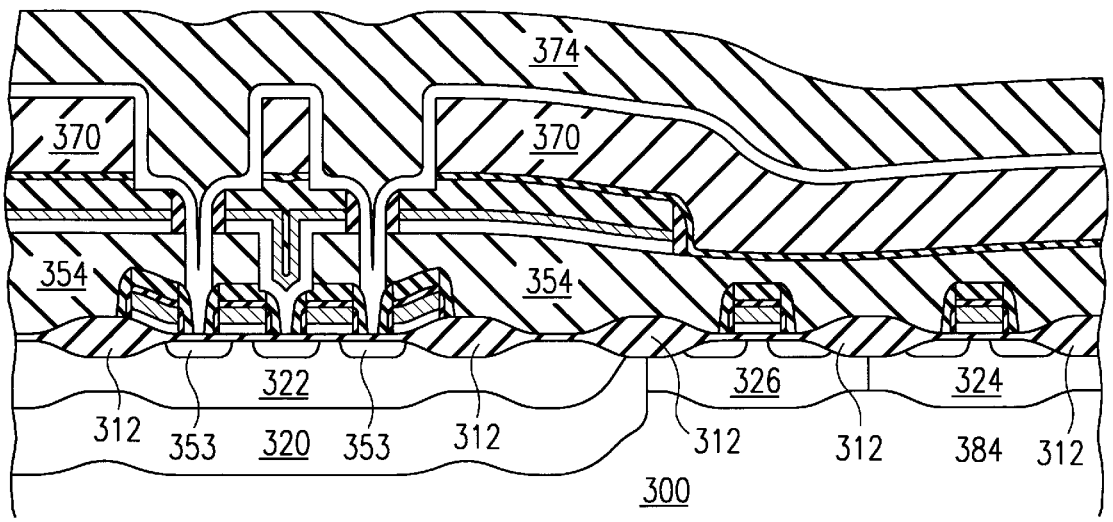
Figure 3V:
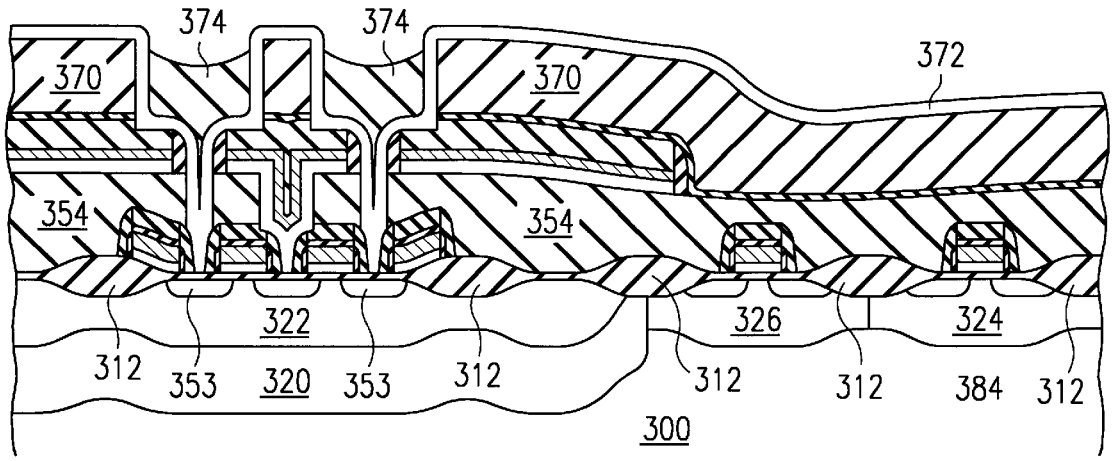
Figure 3W:
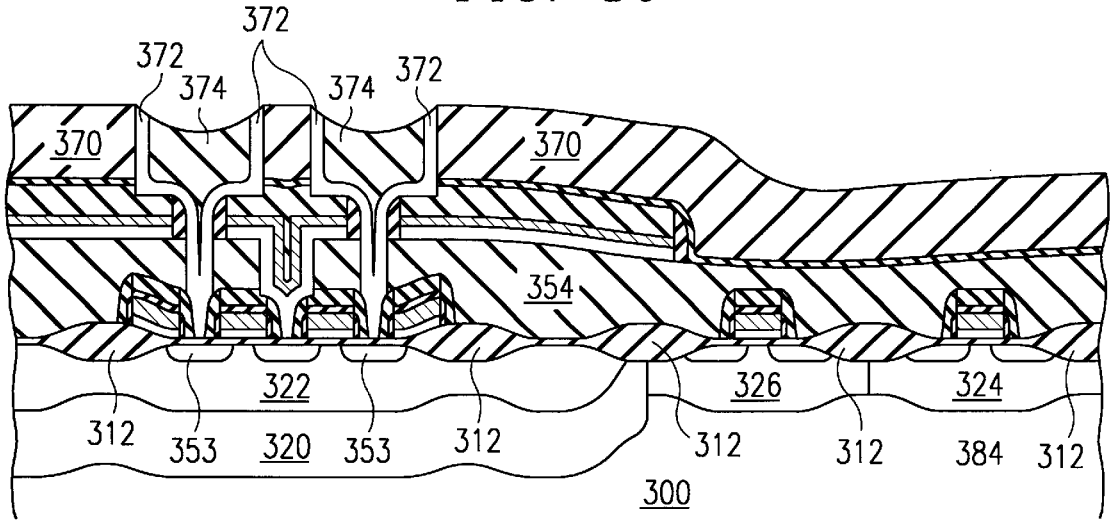
Figure 3X:
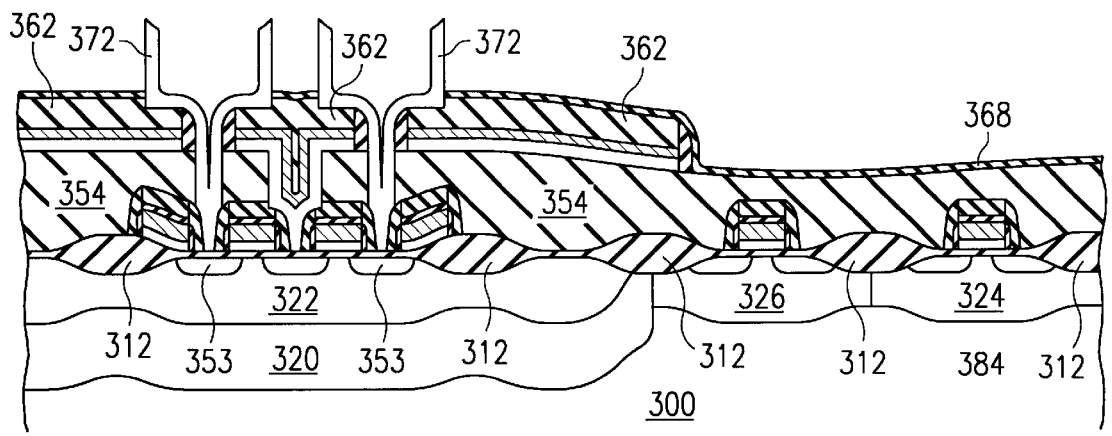

In FIG. 3x crown oxide layer 370 and the remaining portions of the spin-on glass layer 374 are removed using a hydrofluoric acid solution, for example, leaving the vertical portions of layer 372 extending above the substrate as shown. Layer 372 forms each storage cell capacitor's bottom plate electrode.

Figure 3Y:
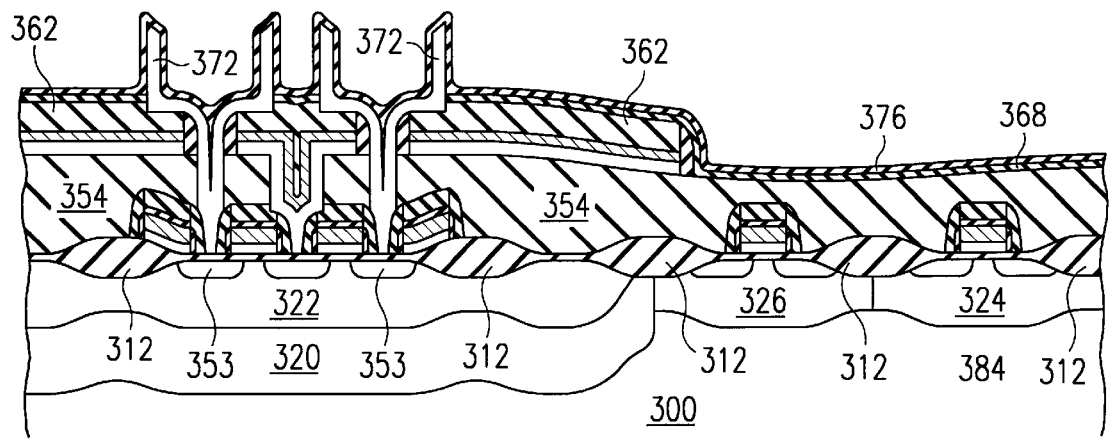
Figure 3Z:
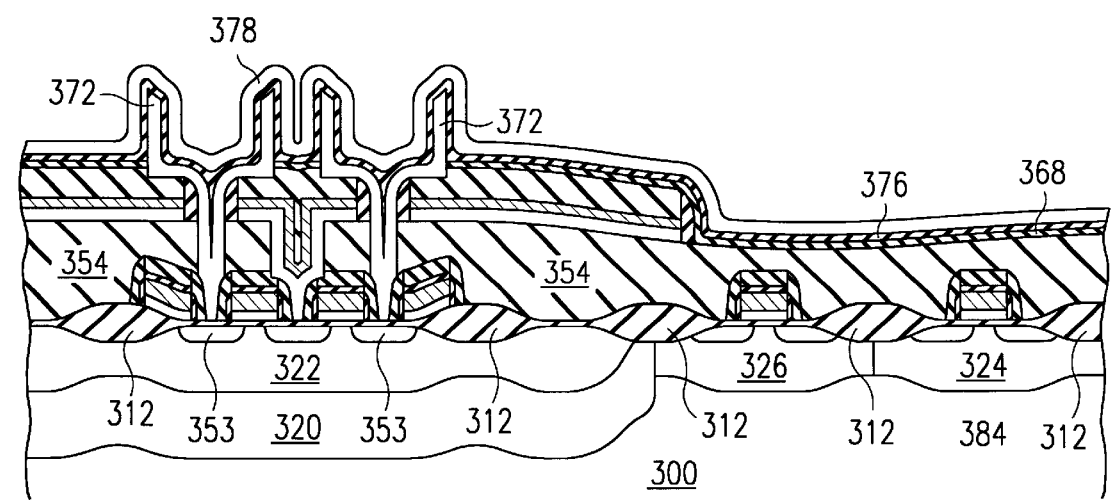
Figure 3A:
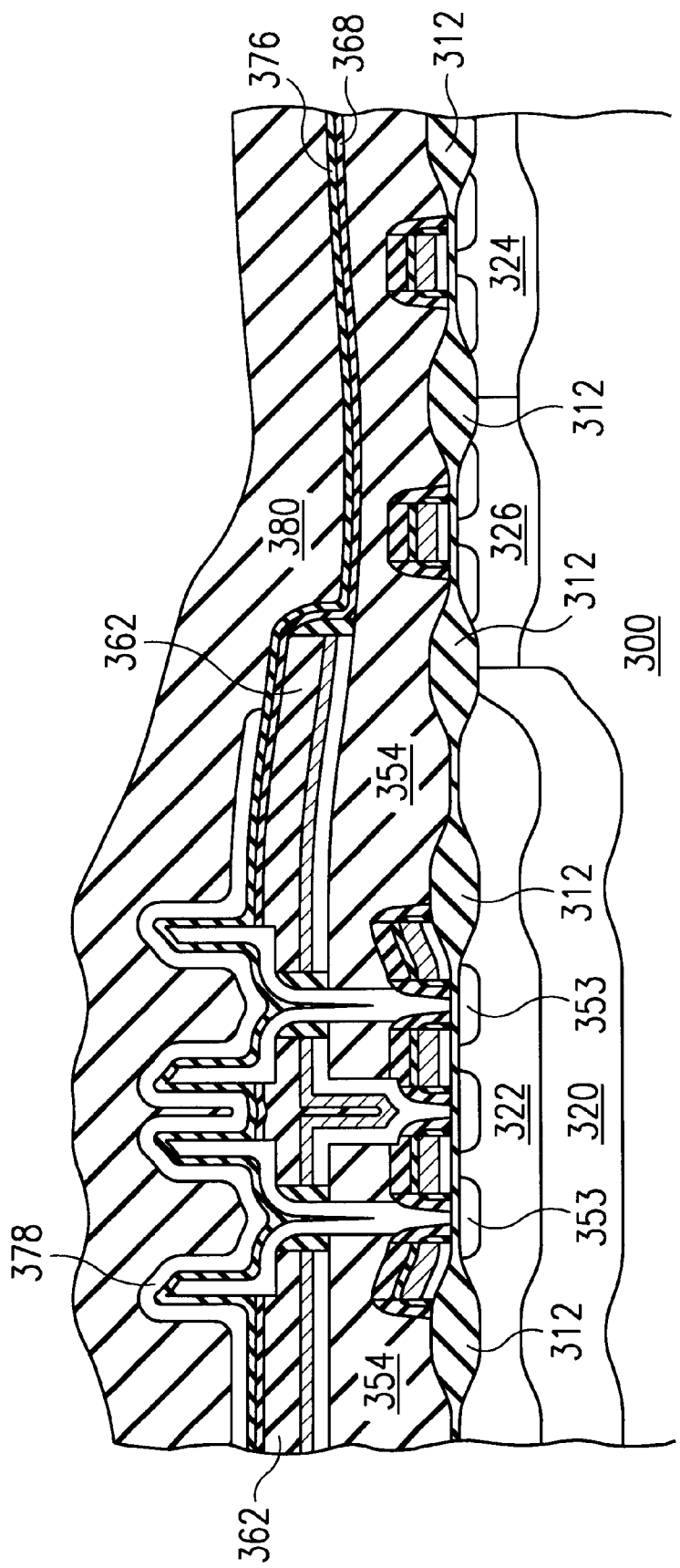
Figure 3B:
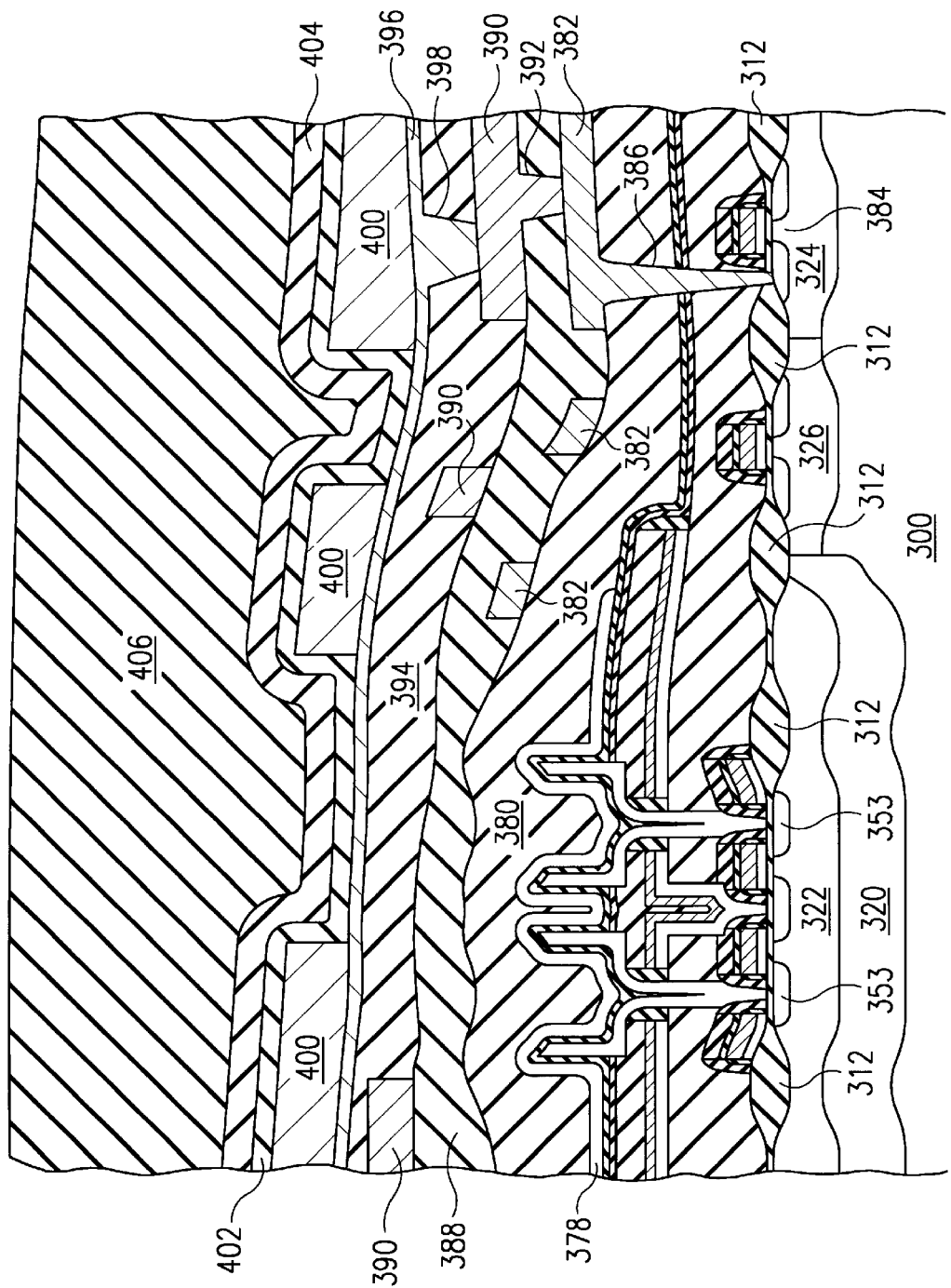

The capacitor dielectric 376 preferably comprises an approximately 6 nm of silicon nitride deposited over the entire structure as shown in FIG. 3y, followed by oxidation at approximately 850° C. for about 18 minutes in steam to reduce the defect density of the nitride film. It may be appreciated that other dielectrics may be suitable; examples include tantalum pentoxide, barium strontium titanate, lead zirconate titanate, and strontium bismuth titanate. In FIG. 3z an approximately 85 nm thick layer of polysilicon 378 is deposited over the capacitor dielectric 376. Polysilicon layer 378 is doped in situ with phosphorus for example toga concentration of approximately 4.5×10$^{20}$ cm$^{-3}$.

In FIG. 3aa the polysilicon layer 378 is etched with a combination of chlorine and SF$_6$ for example to define the extent of the field or common plate electrode of the storage cell capacitors. Oxide layer 380 is then formed over the structure by first decomposing TEOS to produce an approximately 100 nm oxide layer and then by the deposition of borophosphosilicate glass (BPSG) in a thickness of approximately 800 nm. The oxide layer is then etched back to a thickness of approximately 640 nm.

FIG. 3bb shows the structure as it appears prior to the packaging of the circuit. Over the oxide layer 380 is deposited a first metal layer 382 with access to peripheral transistor 384 through via 386. First metal layer 382 is patterned with photoresist and etched as shown to connect portions of the integrated circuit as desired. Oxide layer 380 and first metal layer 382 are then covered by oxide layer 388. Second metal layer 390 is then deposited over oxide layer 388 with access to the first metal layer 382 through via 392. Second metal layer 390 is patterned with photoresist and etched as shown to connect portions of the integrated circuit as desired. Oxide layer 388 and second metal layer 390 are covered by oxide layer 394. Barrier metal layer 396 is then deposited over oxide layer 394, with access to second metal layer 390 through via 398. Third metal layer 400 is deposited over barrier metal layer 396, patterned with photoresist, and etched as shown to connect portions of the integrated circuit as desired. The barrier metal layer 396 and third metal layer 400 are then covered with oxide layer 402. Oxide layer 402 is covered with nitride layer 404, which is in turn covered with polyimide layer 406.

In a second preferred embodiment process the steps in the first preferred embodiment process that involve forming the crown portion of the storage capacitor cell are modified to simplify the process. Specifically, the steps illustrated in FIGS. 3q to 3w can be replaced with those illustrated in FIGS. 4a to 4e. A feature of the second preferred embodiment process is the use of chemical-mechanical polishing (CMP) to level the surface of the structure prior to the formation of the crown portion of the storage capacitor cell.

CMP can be used for planarizing dielectric as well as semiconductor regions. The process involves both chemical and mechanical abrasion. Chemical abrasion is accomplished using a slur to chemically weaken the surface to be leveled. The polishing slurry is typically a mixture of either a basic or an acidic solution, which comprises the chemical component of the slurry, in combination with alumina or silica particles. Mechanical abrasion is accomplished using a polishing pad against which a wafer or layer surface is pressed. Both the polishing pad and the wafer are rotated to cause the removal of surface material. The removed material is then washed over the edges of the polishing pads and into a drain by adding additional slurry. CMP planarization produces a smooth, damage-free surface for subsequent device processing. It requires less steps than a deposition/etchback planarization and has good removal selectivity and rate control.

Figure 4A:
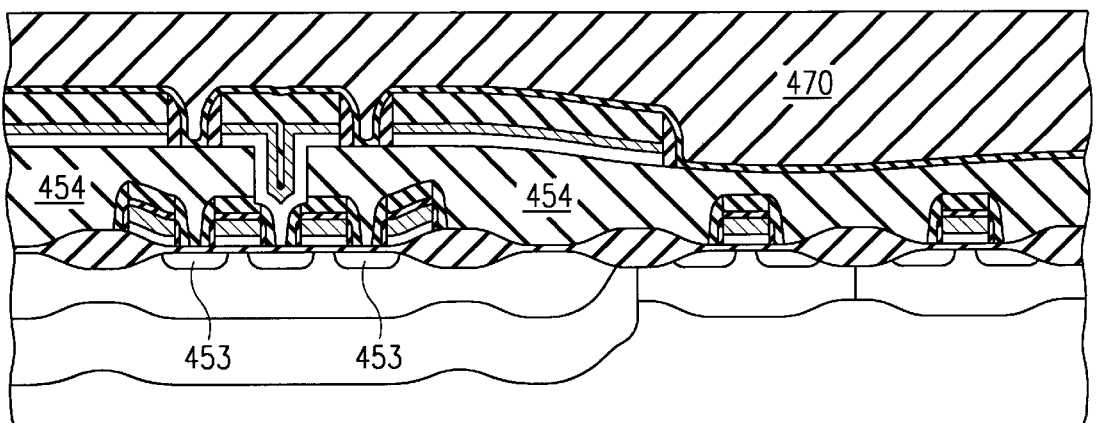
FIGS. 4a to 4e are cross-sectional diagrams of steps in a second preferred embodiment process.

CMP is employed in the second preferred embodiment process as shown in FIG. 4a. In that figure, the surface of the crown oxide layer 470 has been planarized using CMP with a slurry comprising potassium hydroxide (KOH) as the chemical component.

Figure 4B:
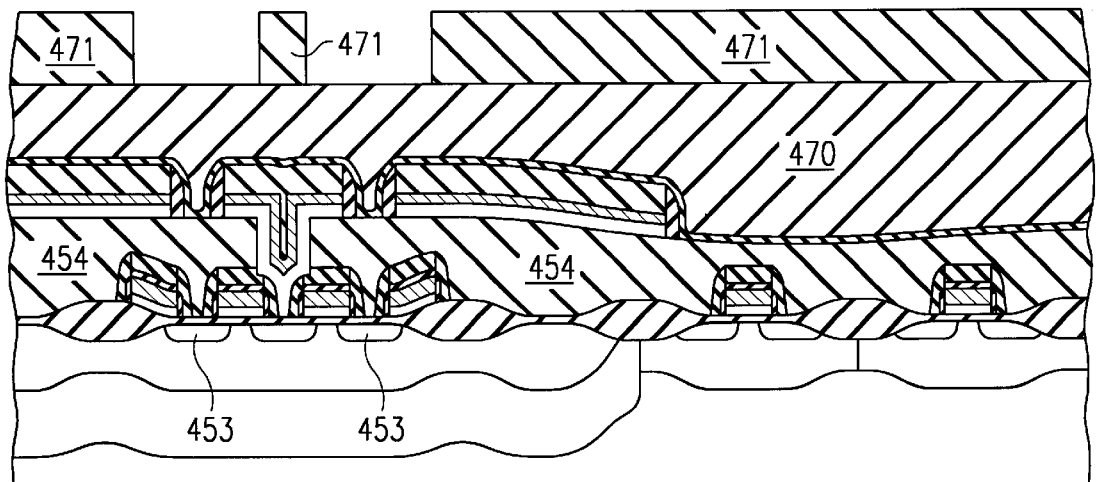
Figure 4C:
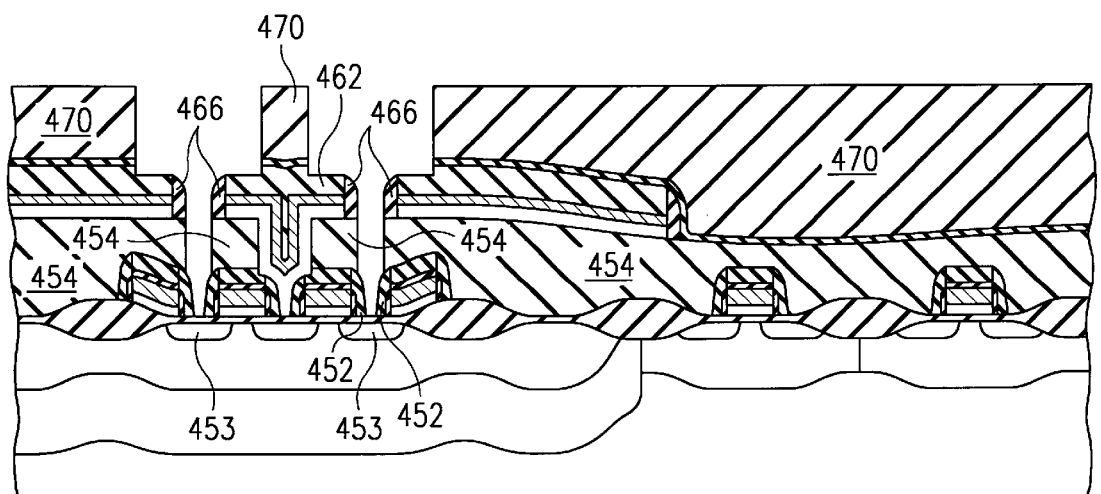

In FIG. 4b photoresist layer 471 is deposited and patterned to expose the portions of the crown oxide layer 470 over the desired location of the storage cell capacitors. Referring now to FIG. 4c, the exposed portions of crown oxide layer 470 are removed using an anisotropic etching process with carbon monoxide as the primary etchant. The removal of the crown oxide layer 470 and oxide layer 454 is performed with relatively little removal of the nitride sidewalls 452, 466 and the nitride layer 462 formed over the bitline because of the anisotropic nature of the reactive ion etching process and the selectivity of the carbon monoxide etchant in removing oxide versus nitride layers. The removal of layers 470 and 454 exposes the transistor contact region 453.

Figure 4D:
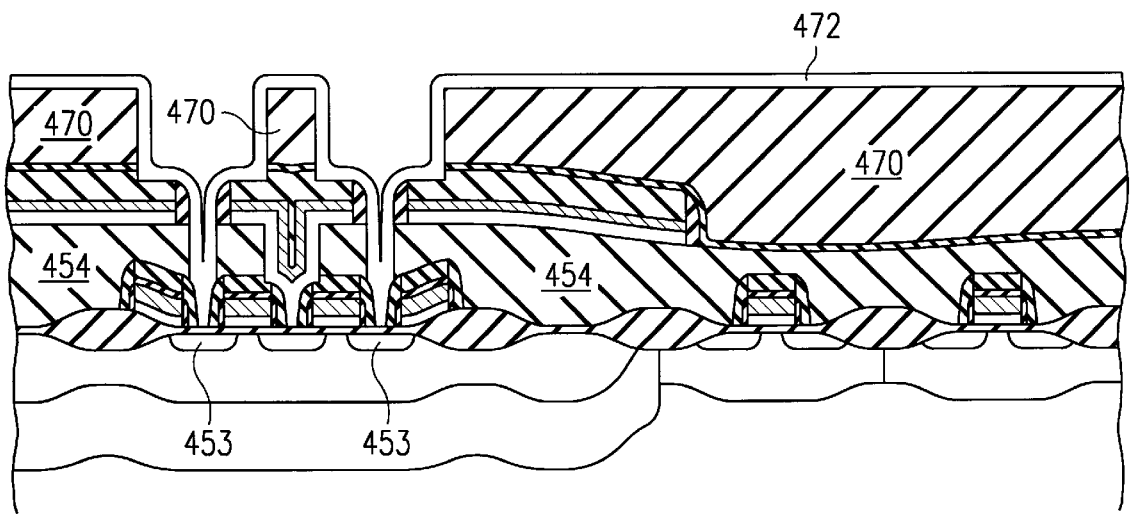
Figure 4E:
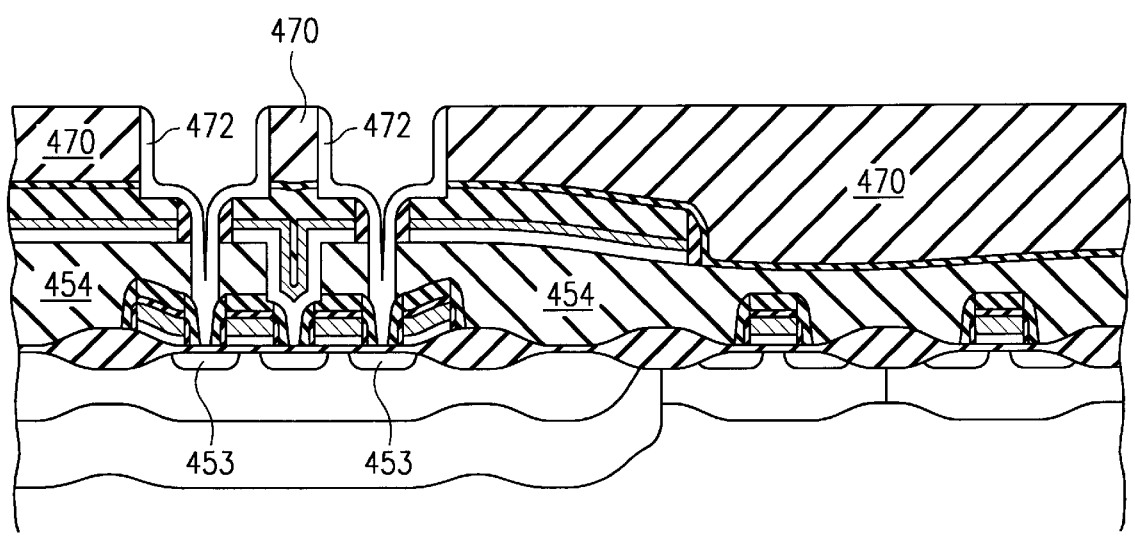

In FIG. 4d, as in FIG. 3t, polysilicon layer 472 is conformally deposited over oxide layer 470. In contrast to the spin-on glass and etch-back steps shown in FIGS. 3u and 3v, the planarized oxide layer 470 in FIG. 4d results in a planar polysilicon layer 472. Thus, the portions of layer 472 not needed to define the storage node electrode of the capacitor are easily removed with another CMP step employing a slurry comprising KOH as the chemical agent. The removal of portions of layer 472 by CMP yields the structure shown in FIG. 4e. The remaining steps of the process are identical to those shown in FIGS. 3x through 3bb with reference to the first preferred embodiment process.

Planarization of oxide layer 470 with CMP is an alternative to application of a spin-on glass (HSQ for example) with an associated etch-back step to form the polysilicon crown of the storage cell capacitor. The act of planarizing oxide layer 470 prior to the deposition of the crown polysilicon 472 makes it possible to selectively remove those portions of polysilicon layer 472 (see FIG. 4d) that are deposited on the planarized surface.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

For example, though the cavity shown in FIG. 3s is shown to have a narrow portion bottomed on a contact region 353 at the surface of a semiconductor substrate. The skilled artisan will appreciate that the cavity could be formed to bottom on a contact region that lies not at the surface of the substrate, but at the surface of a subsequently-applied layer or region. An example would be an upper-level polysilicon interconnection layer.

What is claimed is:

1. A method for fabricating an integrated circuit, comprising the steps of:

forming a contact region in a semiconductor material structure;

covering said semiconductor material structure, excluding said contact region, with a first material;

covering said first material and said contact region with a layer of a second material;

removing portions of said layer of second material and exposing said contact region, said removal of said portions of said layer of second material and exposing said contact region forming a cavity characterized by a bottom of an upper portion being said first material and sides of said upper portion being second material; and forming a conductive layer in said cavity to contact said contact region and conform to said bottom and sides.

2. The method of claim 1, further comprising the steps of:

forming a dielectric layer over said conductive layer; and forming a second conductive layer over said dielectric layer.

3. The method of claim 1, wherein said step of covering said semiconductor material structure with a first material comprises depositing a nitride layer over a bitline and nitride sidewalls on said bitline.

4. The method of claim 1, wherein said step of covering said first material and said contact region comprises depositing an oxide layer.

5. The method of claim 1, wherein said step of forming a conductive layer in said cavity comprises depositing doped polysilicon.

6. The method of claim 2, wherein said step of forming a dielectric layer comprises forming a layer of nitride following by oxidation of said nitride.

7. The method of claim 2, wherein said step of forming a second conductive layer comprises depositing doped polysilicon.

8. A method for fabricating a memory integrated circuit, comprising the steps of:

forming a transistor comprising wordline and first and second contact regions at a first surface of a substrate;

forming a bitline in contact with said first contact region;

forming a first layer of a first material over said bitline;

forming a second layer of a second material over said first layer;

exposing said second contact region by forming a cavity through said second layer, said cavity with an upper portion having a substantially horizontal bottom surface at said first layer and substantially vertical sides at said second layer; and forming a conductive layer in said cavity to contact said second contact region and conform to said bottom and sides.

9. The method of claim 8, further comprising the steps of:

forming a dielectric layer over said conductive layer;

forming a second conductive layer over said dielectric layer.

10. The method of claim 8, further comprising the step of forming sidewalls on said bitline.

11. The method of claim 10, wherein said step of forming sidewalls comprises forming nitride sidewalls.

12. The method of claim 8, wherein said step of forming a first layer of a first material over said bitline comprises depositing nitride.

13. The method of claim 8, wherein said step of forming a second layer of a second material over said first layer comprising depositing oxide.

14. The method of claim 8, wherein said step of forming a first conductive layer in said cavity comprises depositing doped polysilicon.

15. The method of claim 9, wherein said step of forming a dielectric layer comprises forming a layer of nitride following by oxidation of said nitride.

16. The method of claim 9, wherein said step of forming a second conductive layer comprises depositing doped polysilicon.

* * * * *

UNITED STATES PATENT AND TRADEMARK OFFICE
CERTIFICATE OF CORRECTION

PATENT NO. : 6,617,211 B1
DATED : September 9, 2003
INVENTOR(S) : Takayuki Niuya It is certified that error appears in the above-identified patent and that said Letters Patent is hereby corrected as shown below:

<u>Title page,</u>
Insert Item [60]:
--            Related U.S. Application Data
[60] Provisional Application No. 60/030,878 filed 11/14/1996. --

Signed and Sealed this

Twentieth Day of January, 2004

JON W. DUDAS
*Acting Director of the United States Patent and Trademark Office*